United States Patent
Sirkis et al.

(10) Patent No.: US 6,799,532 B2
(45) Date of Patent: Oct. 5, 2004

(54) STABILIZED OSCILLATOR CIRCUIT FOR PLASMA DENSITY MEASUREMENT

(75) Inventors: Murray D. Sirkis, Tempe, AZ (US); Joseph T. Verdeyen, Savoy, IL (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/650,802

(22) Filed: Aug. 29, 2003

(65) Prior Publication Data

US 2004/0007983 A1 Jan. 15, 2004

Related U.S. Application Data

(63) Continuation of application No. 10/031,373, filed as application No. PCT/US00/19540 on Jul. 20, 2000, now Pat. No. 6,646,386.
(60) Provisional application No. 60/144,878, filed on Jul. 21, 1999, provisional application No. 60/144,880, filed on Jul. 20, 1999, provisional application No. 60/144,833, filed on Jul. 20, 1999, and provisional application No. 60/166,418, filed on Nov. 19, 1999.

(51) Int. Cl.[7] .......................... C23C 16/00; C23F 1/02
(52) U.S. Cl. .................. 118/723 MW; 118/723 R; 156/345.24; 156/345.26; 156/345.28
(58) Field of Search .......................... 118/723; 156/345; 204/298, 192

(56) References Cited

U.S. PATENT DOCUMENTS

| | | | |
|---|---|---|---|
| 2,405,229 A | 8/1946 | Mueller et al. |
| 2,483,189 A | 9/1949 | Eaglesfield |
| 2,735,941 A | 2/1956 | Peck |
| 2,971,153 A | 2/1961 | Wharton et al. |
| 3,265,967 A | 8/1966 | Heald |
| 3,290,614 A | 12/1966 | Racy |
| 3,383,509 A | 5/1968 | Goldstein et al. |
| 3,388,327 A | 6/1968 | Sutton et al. |
| 3,416,077 A | 12/1968 | Lacy |
| 3,439,266 A | 4/1969 | Rogers |
| 3,474,336 A | 10/1969 | Alford |
| 3,490,037 A | 1/1970 | Williams |
| 3,509,452 A | 4/1970 | Walker |
| 3,572,948 A | 3/1971 | Catherin |
| 3,599,089 A | 8/1971 | Bugnolo |
| 3,699,475 A | 10/1972 | Rogers |
| 3,899,752 A | 8/1975 | Engelmann |
| 3,956,695 A | 5/1976 | Stamm |
| 4,034,312 A | 7/1977 | Armand |
| 4,096,453 A | 6/1978 | Rogers |
| 4,354,166 A | 10/1982 | Grudkowski |
| 4,540,955 A | 9/1985 | Fiedziuszko |
| 4,775,845 A | 10/1988 | McCoy |
| 4,899,100 A | 2/1990 | Talanker et al. |
| 4,944,211 A | 7/1990 | Rowan et al. |
| 4,949,053 A | 8/1990 | Havens |
| 4,952,246 A | 8/1990 | Seeley |
| 5,082,517 A | 1/1992 | Moslehi |

(List continued on next page.)

FOREIGN PATENT DOCUMENTS

| | | |
|---|---|---|
| EP | 0 432 573 | 6/1991 |
| WO | WO 01/06544 | 1/2001 |
| WO | WO 01/37306 | 5/2001 |

OTHER PUBLICATIONS

P.K. Atrey et al., "Measurement of chord averaged electron density in ADITYA using 100 GHz and 136 GHz interferometers", Indian J. Physics 66B (5 & 6), 1992, pp. 489–497.

(List continued on next page.)

*Primary Examiner*—Tuyet T. Vo
(74) *Attorney, Agent, or Firm*—Oblon, Spivak, McClelland, Maier & Neustadt, P.C.

(57) ABSTRACT

A method and system for controlling electron densities in a plasma processing system. By applying a dither voltage and a correction voltage to a voltage-controlled oscillator, electron (plasma) density of a plasma processing system (acting as an open resonator) may be measured and controlled as part of a plasma-based process.

22 Claims, 6 Drawing Sheets

U.S. PATENT DOCUMENTS

| | | | |
|---|---|---|---|
| 5,245,405 A | 9/1993 | Mitchell et al. | |
| 5,304,282 A | 4/1994 | Flamm | |
| 5,383,019 A | 1/1995 | Farrell et al. | |
| 5,455,565 A | 10/1995 | Moeenziai et al. | |
| 5,506,475 A | 4/1996 | Alton | |
| 5,568,801 A | 10/1996 | Paterson et al. | |
| 5,621,331 A | 4/1997 | Smith et al. | |
| 5,691,642 A | 11/1997 | Dobkin | |
| 5,907,820 A | 5/1999 | Pan | |
| 5,936,413 A | 8/1999 | Booth et al. | |
| 5,939,886 A | 8/1999 | Turner et al. | |
| 5,945,888 A | 8/1999 | Weinert et al. | |
| 6,027,601 A | 2/2000 | Hanawa | |
| 6,074,568 A | 6/2000 | Adachi et al. | |
| 6,260,408 B1 | 7/2001 | Vig et al. | |
| 6,339,297 B1 | 1/2002 | Sugai et al. | |
| 6,573,731 B1 * | 6/2003 | Verdeyen et al. | 324/639 |

OTHER PUBLICATIONS

D. Bora et al., "Plasma density measurement using a simple microwave technique", Rev. Sci. Instrum. 59 (10), Oct. 1988, pp. 2149–2151.

D. Bora et al., "A simple microwave technique for plasma density measurement using frequency modulation", Plasma Physics and Controlled Fusion 26 (7), 1984 pp. 853–857.

Nils Brenning, "An Improved microwave interferometer technique for plasma density measurements: II", J. Phys. E: Sci. Instrum. 21, 1988, pp. 578–582.

N. Brenning, "An improved microwave interferometer technique for plasma density measurements", J. Phys. E: Sci. Instrum. 17, 1984, pp. 1018–1023.

M. A. G. Calderon et al., "Experimental study of a swept reflectometer with a single antenna for plasma density profile measurement", International Journal of Infrared and Millimeter Waves 6 (7), 1985, pp. 605–628.

G. D. Conway et al., "Plasma density fluctuation measurements from coherent and incoherent microwave reflection", Plasma Phys. Control. Fusion 38, 1996, pp. 451–466.

P. C. Efthimion et al., "1–millimeter wave interferometer for the measurement of line integral electron density on TFTR", Rev. Sci. Instrum. 56 (5), May 1985, pp. 908–910.

J. A. Fessey et al., "Plasma electron density measurements from the JET 2 mm wave interferometer", J. Phys. E: Sci. Instrum. 20, 1987, pp. 169–174.

H. Kumar et al., "Measurements of plasma density in argon discharge by Langmuir probe & microwave interferometer", Indian Journal of Pure & Applied Physics 17, May 1979, pp. 316–318.

G. Neumann et al., "Plasma–density measurements by microwave interferometry and Langmuir probes in an rf discharge", Rev. Sci. Instrum. 64 (1), Jan. 1993, pp. 19–25.

Lawrence J. Overzet et al., "Comparison of electron–density measurements made using a Langmuir probe and microwave interferometer in the Gaseous Electronics Conference reference reactor", J. Appl. Phys. 74 (7), Oct. 1, 1993, pp. 4323–4330.

John A.Thornton, "Diagnostic methods for sputtering plasmas", J. Vac. Sci. Technol. 15 (2), Mar./Apr. 1978, pp. 188–192.

J. R. Wallington et al., "A sensitive microwave interferometer for plasma diagnostics", J. Plasma Physics 3 (part 3), 1969, pp. 371–375.

M. Haverlag et al., "Measurements of negative ion densities in 13.56–MHz rf plasmas of $CF_4$, $C_2F_6$, $CHF_3$ and $C_3F_6$ using microwave resonance and the photodetachment effect", J. Appl. Phys. 70 (7), Oct. 1, 1991, pp. 3472–3480.

M. Haverlag et al., "Negatively charged particles in fluorocarbon rf etch plasmas: Density measurements using microwave resonance and the photodetachment effect", Materials Science Forum, vol. 140–142, 1993, pp. 235–254.

G. R. Hanson et al., "Density fluctuation measurements in ATF using correlation reflectometry", Nuclear Fusion 32 (9), 1992, pp. 1593–1608.

G. R. Hanson et al., "A swept two–frequency microwave reflectometer for edge density profile measurements on TFTR", Rev. Sci. Instrum. 63 (10), Oct. 1992, pp. 4658–4660.

K. W. Kim et al., "Development of a fast solid–state high-resolution density profile reflectometer system on the DIII–D tokamak", Rev. Sci. Instrum. 68 (1), Jan. 1997, pp. 466–469.

P. Millot et al., "An advanced radar technique for electron density measurements on large tokamaks", Eighteenth International Conference on Infrared and Millimeter Waves, James R. Birch, Terence J. Parker, Editors, Proc. SPIE 2104, 1993, pp. 240–241.

Masaaki Nagatsu et al., "Application of maximum entropy method to density profile measurement via microwave reflectometry on GAMMA 10", Plasma Phys. Control. Fusion 38, pp. 1033–1042.

R. Nazikian et al., "Reflectometer measurements of density fluctuations in tokamak plasmas (invited)", Rev. Sci. Instrum. 66 (1), Jan. 1995, pp. 392–398.

L. J. Overzet et al., "Enhancement of the plasma density and deposition rate in rf discharges", Appl. Phys. Lett. 48 (11), Mar. 17, 1986, pp. 695–697.

R. Schubert, "Sensor for plasma density profile measurement in magnetic fusion machine", Sensors and Actuators A 41–42, 1994, pp. 53–57.

S. Shammas et al., "Simplified microwave measurement of uv photoplasmas", J. Appl. Phys. 51 (4), Apr. 1980, pp. 1970–1974.

A. C. C. Sips et al., "Analysis of reflectometry density profile measurements in JET", Plasma Phys. Control. Fusion 35, 1993, pp. 743–755.

W. Hess et al., "A new 17 . . . 23 GHz cavity stabilized, hermetically sealed module VCO in chip technique", Conference proceedings of the 22nd European Microwave Conference, vol. 1, Aug. 24–27, 1992, pp. 143–148. INSPEC abstract No. B9211–1350H–047.

H. Flugel et al., "Cavity stabilisation techniques for harmonic–mode oscillators", Proceedings of the eighth colloquium on microwave communication, Aug. 25–29, 1986, pp. 393–394. INSPEC abstract No. B88050407.

Helmut Barth, "A high Q cavity stabilized Gunn oscillator at 94 GHz", 1986 IEEE MTT–S International Microwave Symposium Digest, Jun. 2–4, 1986, pp. 179–182. INSPEC abstract No. B87006105.

P. M. Marshall et al., "Simple technique cavity–stabilizes VCO", Microwaves & RF 24 (7), Jul. 1985, pp. 89–92. INSPEC abstract No. B86014481.

M. E. Znojkiewicz, "8 GHz low noise bias tuned VCO", 1984 IEEE MTT–S International Microwave Symposium Digest, May 29–Jun. 1, 1984, pp. 489–491. INSPEC abstract No. B85017875.

A. Jacob et al., "Optimum design of cavity stabilized FET oscillators", Conference Proceedings of the 13th European Microwave Conference, Sep. 5–8, 1983, pp. 509–514. INSPEC abstract No. B84009181.

Brian E. Rose, "10 GHz cavity stabilized FET oscillator", Proceedings of the 32nd Annual Frequency Control Symposium, May 31–Jun. 2, 1978, pp. 385–388. INSPEC abstract No. B79030122.

Klaus Schunemann et al., "On the matching transmission cavity stabilized microwave oscillators", IEEE transaction on microwave theory and techniques MTT–26 (3), Mar. 1978, pp. 147–155. INSPEC abstract No. B78028026.

Brian Owen, "Mechanically tuneable, cavity–stabilized millimeter–wave IMPATT oscillators", 1977 IEEE MTT–S International Microwave Symposium Digest, 1977, pp. 22–25. INSPEC abstract No. B78005511.

Walter R. Day, "Frequency modulation of cavity stabilized solid state diode oscillators", 1973 IEEE–G–MTT International Microwave Symposium Digest of Technical Papers, Jun. 4–6, 1973, pp. 247–249. INSPEC abstract No. B74005473.

J. Clarke, "A simple stabilized microwave source", IEEE Transactions on Instrument and Measurement, vol. IM–21 (1), Feb. 1972, pp. 83–84. INSPEC abstract No. B72013995.

David I. C. Pearson et al., "A microwave interferometer for density measurement and stabilization in process plasmas", Materials Research Society Symposium Proceedings 117, Apr. 5–7, 1988, pp. 311–317.

M. Manso et al., "Localized density measurements on ASDEX using microwave reflectometry", Max–Planck–Institut Plasmaphysik Technical Report IPP III/164, Paper No. R1, Sep. 1990, 4 pages.

A. Silva et al., "First density measurements with microwave reflectometry as ASDEX upgrade", Max–Planck–Institut Plasmaphysik Technical Report IPP 1/277, Oct. 1993, pp. 154–157.

Kai Chang, "Millimeter–wave spatial and quasi–optical power combining techniques", International conference on millimeter waves and far–infrared technology conference digest (Cat. No. 89TH0257–6), 1989, pp. 431–434.

Jin–Bang Tang et al., "Finite element analysis of the dielectric resonator", International conference on millimeter waves and far–infrared technology conference digest (Cat. No. 89TH0257–6), 1989, pp. 435–438.

I. V. Altukhov et al., "Far infrared radiation from uniaxially compressed p–type GE", International conference on millimeter waves and far–infrared technology conference digest (Cat. No. 89TH0257–6), 1989, pp. 439–442.

Fu–Jiang Liao et al., "Developing status of millimeter wave tubes in China", International conference on millimeter waves and far–infrared technology conference digest (Cat. No. 89TH0257–6), 1989, pp. 443–446.

Li–Rong Jin et al., "D–band silicon IMPATT diode", International conference on millimeter waves and far–infrared technology conference digest (Cat. No. 89TH0257–6), 1989, pp. 447–449.

Sheng–Min Liu et al., "The millimeter wave Gunn oscillator and self–oscillating mixer using the nonradiative dielectric waveguide", International conference on millimeter waves and far–infrared technology conference digest (Cat. No. 89TH0257–6), 1989, pp. 450–452.

Wei Hong et al., "Study on broadband millimeter oscillators", International conference on millimeter waves and far–infrared technology conference digest (Cat. No. 89TH0257–6), 1989, pp. 453–456.

Dunfu Li et al., "Influence of moisture on cavity–stabilized oscillators", International conference on millimeter waves and far–infrared technology conference digest (Cat. No. 89TH0257–6), pp. 457–460.

D. Ni et al., "Millimeter–wave generation and characterization of a GaAs FET by optical mixing", International conference on millimeter waves and far–infrared technology conference digest (Cat. No. 89TH0257–6, 1989, p. 493.

Jing–Feng Miao et al., "New NRD guide oscillator", International conference on millimeter waves and far–infrared technology conference digest (Cat. No. 89TH0257–6), 1989, pp. 494–496.

Yu–Fen Yang et al., "8mm pulse IMPATT oscillators", International conference on millimeter waves and far–infrared technology conference digest (Cat. No. 89TH0257–6), 1989, pp. 497–499.

Ning Chen et al., "Novel large signal mathematical model of mm–wave Gunn device", International conference on millimeter waves and far–infrared technology conference digest (Cat. No. 89TH0257–6), 1989, pp. 500–502.

Wang Dongjin et al., "VCO for millimeter–wave phase–locked sources", International conference on millimeter waves and far–infrared technology conference digest (Cat. No. 89TH0257–6), 1989, pp. 503–505.

Wang Dongjin , "A new viewpoint on the operation principles of the reflection type cavity–stabilized Gunn oscillator", International conference on millimeter waves and far–infrared conference digest (Cat. No. 89TH0257–6), 1989, pp. 506–509.

S. P. Kuo et al., "Operation of a sixteenth harmonic cusptron oscillator", International conference on millimeter waves and far–infrared technology conference digest (Cat. No. 89TH0257–6), 1989, pp. 510–513.

Igor Alexeff et al., "Recent developments in the Orbitron MASER", International conference on millimeter waves and far–infrared technology conference digest (Cat. No. 89TH0257–6), 1989, pp. 583–587.

V. K. Malyutenko et al., "Thermal–emitting diodes for IR", International conference on millimeter waves and far–infrared technology conference digest (Cat. No. 89TH0257–6), 1989, pp. 588–590.

Valentin M. Feru et al., "An absolute radiometric evaluation of the spectral irradiance created by the optical radiation sources", International conference on millimeter waves and far–infrared technology conference digest (Cat. No. 89TH0257–6), 1989, p. 591.

V. I. Gavrilenko et al., "Negative cyclotron mass MASER—A new type of semiconductor generator for millimeter and submillimeter wave range", International conference on millimeter waves and far–infrared technology conference digest (Cat. No. 89TH0257–6), 1989, pp. 592–596.

E. V. Beregulin et al., "Saturation absorption of the IR–FIR radiation in semiconductors and its technical utilization", International conference on millimeter waves and far–infrared technology conference digest (Cat. No. 89TH0257–6), 1989, pp. 597–600.

I. E. Aronov et al., "Radiowave excitation of resonant D. C. electromotive force in metals", International conference on millimeter and far–infrared technology conference digest (Cat. No. 89TH0257–6), 1989, p. 601.

M. V. Burtyka et al., "Instability of electromagnetic oscillators of the millimeter wave range specified by injection of charge carrier in inhomogeneous semiconductor structures", International conference on millimeter waves and far–infrared technology conference digest (Cat. No. 89TH0257–6), 1989, pp. 602–605.

Li Dunfu et al., "Stability condition for 8mm phase–locked source", International conference on millimeter waves and far–infrared technology conference digest (Cat. No. 89TH0257–6), 1989, pp. 606–609.

Wanjun Bi et al., "Experimental study of an overmode power combiner of 8mm IMPATT diodes", International conference on millimeter waves and far–infrared technology conference digest (Cat. No. 89TH0257–6), 1989, pp. 610–613.

Hua–fang Zhang et al., "Varactor–tuned Ka–band Gunn oscillator", International conference on millimeter waves and far–infrared technology conference digest (Cat. No. 89TH0257–6), 1989, pp. 614–616.

A. A. Lavrinovich, "7mm traveling–wave MASER with gain bandwidth exceeding 200 MHz", International conference on millimeter waves and far–infrared technology conference digest (Cat. No. 89TH0257–6), 1989, pp. 617–618.

Th G van de Roer, et al., Journal of Physics E: Scientific Instruments, vol. 3, No. 2, pp. 96–100, XP–001098603, "Automatic Display of Electron Density in a Plasma Column", Feb. 1970.

R. E. Eaves, et al., IEEE Transactions on Antennas and Propagation, vol. AP–19, No. 2, pp. 221–226, XP–001097480, "Determination of Plasma Electron–Density Distribution from the Resonant Frequencies of a Parallel–Plate Cavity", Mar. 1971.

Johnson et al., U.S. 2002/0125223, "Radio Frequency Power Source for Generating an Inductively Coupled Plasma", Sep. 12, 2002.

* cited by examiner

NORMALIZED TRANSMISSION

DISCRIMINATOR OUTPUT

STABILIZED OSCILLATOR CIRCUIT FOR PLASMA DENSITY MEASUREMENT

CROSS-REFERENCE TO RELATED APPLICATIONS

This application is a continuation of U.S. application Ser. No. 10/031,373, filed Apr. 25, 2002, now U.S. Pat. No. 6,646,386, which is a 371 of International Application Serial No. PCT/US00/19540, filed Jul. 20, 2000, which claims the benefit of U.S. Provisional Application Ser. No. 60/166,418, filed Nov. 19, 1999. The present application is related to U.S. provisional application Ser. No. 60/144,880, filed Jul. 20, 1999, U.S. provisional application Ser. No. 60/144,878, filed Jul. 21, 1999, and U.S. provisional application Ser. No. 60/144,833, filed Jul. 20, 1999. All of those applications are incorporated herein by reference in their entirety.

BACKGROUND OF THE INVENTION

1. Field of the Invention

The present invention provides a method and system for measuring and controlling electron densities in a plasma processing system, such as is used in semiconductor processing systems.

2. Description of the Background

Following the Second World War, several university research groups used microwave technology that had been developed during the war to study partially ionized gases. In particular, Professor Sanborn C. Brown's group at Massachusetts Institute of Technology developed and exploited the so-called "cavity technique" for the measurement of electron density in partially ionized, electrically quasi-neutral gases, which have come to be called plasmas.

In this procedure, changes in the resonant behavior of a microwave cavity were studied as a consequence of the presence of a plasma within it. Typically, a right, circularly cylindrical cavity operating in its lowest or nearly lowest order resonant mode was used, and the gas was contained within a coaxial Pyrex™ or quartz tube. An aperture was provided in each planar end surface to permit passage of the tube through the cavity.

The presence of a plasma within a microwave cavity will, in general, affect both the resonant frequency of a particular cavity mode and the sharpness (Q) of the resonance; i.e., the precision with which the frequency of a microwave signal must be fixed if the resonant mode is to be appreciably excited. Using a form of perturbation theory, it is possible to relate the changes in these parameters to the electron density and the electron collision frequency in the plasma. The perturbation theory is valid only for (radian) frequencies that satisfy the condition:

$$\omega^2 >> \omega_p^2 \cong 3.18 \times 10^9 N_e$$

where $\omega_p$ is the plasma (radian) frequency, and $N_e$ is the electron density in electrons/cm$^3$. Consequently, for the diagnosis of plasmas with electron densities of the order of $10^{12}$ cm$^{-3}$, the magnitudes of interest here, a microwave signal frequency ($\omega/2\pi$) in excess of tens of GHz is required.

The requirement of signal frequencies on the order of tens of GHz causes a significant problem. The physical dimensions of a cavity designed to resonate in its lowest or nearly lowest order resonant mode are on the order of the wavelength of the signal. Thus, a cavity designed to resonate at about 35 GHz has dimensions on the order of only a centimeter. The use of such a small cavity for electron density measurements is difficult.

In principle it is possible to use a cavity designed to resonate in a "higher order" mode to overcome the problem associated with the small physical size of a lowest or low order mode. However, if this approach is taken, it becomes extremely difficult to know with certainty the identity of a particular excited cavity mode. Consequently, it becomes practically very difficult, if not impossible, to apply perturbation theory to determine the electron density and the electron collision frequency.

One way to circumvent this problem is to use an "open" resonator, i.e., a resonator in which the electromagnetic field is not confined by a (nearly) completely enclosing conducting surface. A practical example of an open resonator is a pair of large aperture, circularly symmetrical end mirrors, with planar or curved surfaces and with no confining circularly symmetrical conducting surface between them. Open resonators of this type were considered in great detail by A. G. Fox and T. Li in "Resonant modes in a MASER interferometer," Bell System Technical Journal, vol. 40, pp. 453–488, March 1961. Fox et al. showed that any mode that could be regarded as including a plane wave component propagating at a significant angle with respect to the axis of symmetry would not be appreciably excited, i.e., would have a very low Q. In effect, for an open resonator, the number of practically useful modes with resonant frequencies in a particular frequency range is far less than the equivalent number for a closed resonator of similar size. This property of open resonators provided an enormous opportunity for researchers to extend resonant plasma diagnostic techniques to frequencies above 35 GHz.

Microwave energy may be coupled from a waveguide feed to an open resonator using the same principles that govern coupling from a waveguide feed to a closed resonator. The location, spatial rotation, and size of a coupling aperture in a resonator mirror has to be appropriately related to the configuration of the electromagnetic field for the desired resonator mode. The input and output coupling apertures may both be on the same mirror or the input aperture may be on one mirror and the output aperture on the other.

Known electronically tunable microwave oscillators are frequency stabilized with the aid of a resonant cavity and a microwave discriminator. The basic concepts are documented in detail in various M.I.T. Radiation Laboratory Reports and in the Radiation Laboratory Series published by McGraw-Hill in 1947. One use of those oscillators is to cause an electronically tunable oscillator to track the resonant frequency of a microwave resonator as that frequency is changed. An extensive discussion of the techniques is presented in Vol. 11, Technique of Microwave Measurements, M.I.T. Radiation Laboratory Series, Carol H. Montgomery, Editor, McGraw-Hill Book Company, New York, 1947, pp.58–78 (hereinafter "Montgomery"). The entire contents of Montgomery are hereby incorporated by reference. The use of a microwave interferometer is also described in two known publications: (1) "A Microwave Interferometer for Density Measurement Stabilization in Process Plasmas," by Pearson et al., Materials Research Society Symposium Proceedings, Vol. 117 (Eds. Hays et al.), 1988, pgs. 311–317, and (2) "1-millimeter wave interferometer for the measurement of line integral electron density on TFTR," by Efthimion et al., Rev. Sci. Instrum. 56 (5), May 1985, pgs. 908–910.

SUMMARY OF THE INVENTION

It is an object of the present invention to provide an improved plasma electron density measurement and control system using a microwave oscillator locked to an open resonator containing a plasma.

These and other objects of the present invention are achieved by a circuit for stabilizing the oscillation frequency of a voltage-controlled oscillator (VCO) as part of a system for measuring electron (plasma) density.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

Figure 1:
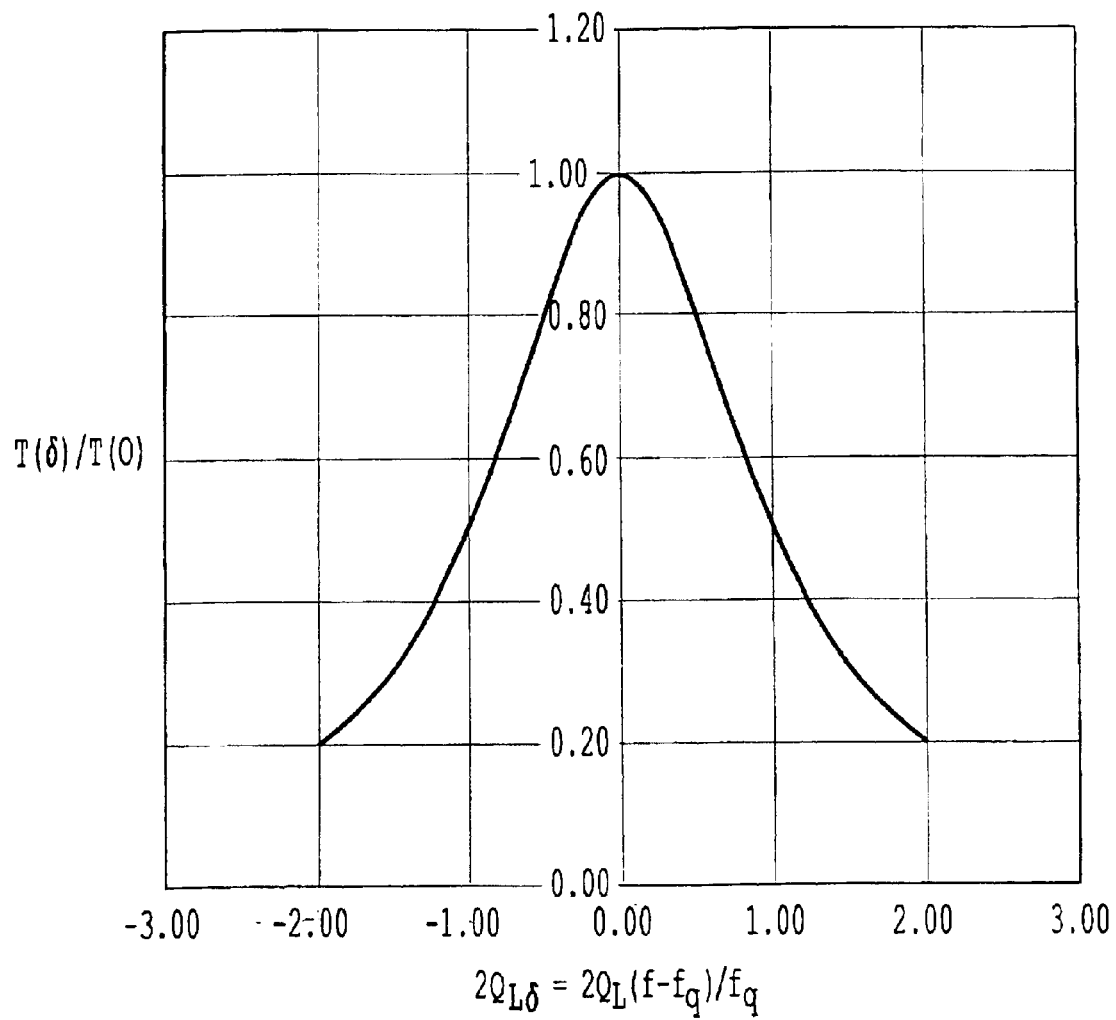
FIG. 1 is a graph showing normalized transmission.

Referring now to the drawings, in which like reference numerals designate identical or corresponding parts throughout the several views, FIG. 1 is a graph showing normalized transmission of power in a resonator. It is well known that the transmission of power through a resonator near a resonant frequency $f_q$ can be expressed in the form:

$$T(\delta) = \frac{T(0)}{1 + (2Q_L\delta)^2} \quad \text{Eq. 1}$$

where $$\delta = \frac{f - f_q}{f_q} \quad \text{Eq. 2}$$

is the normalized frequency. In these equations, f is the oscillation frequency, $f_q$ is the reference frequency (i.e., the resonant frequency of the open resonator for an axial mode; e.g., a $TEM_{00q}$ mode), $Q_L$ is the loaded quality factor (i.e., the loaded Q) of the open resonator, and $T(\delta)$ is the transmitted power. $T(0)$ is the transmitted power when the oscillation frequency equals the resonant frequency (i.e., when $f=f_q$). As shown in FIG. 1, a plot of $T(\delta)$ as a function of $\delta$ displays the well-known bell-shaped characteristic with its peak at $\delta=0$.

One method of applying power to a resonator is via a voltage-controlled oscillator (VCO). In a VCO, the voltage applied to a control-input terminal controls the oscillation frequency.

Even if the frequency, $f_s$, of the VCO is slightly different from $f_q$, appreciable power may be transmitted through the open resonator if $f_q$ and $f_s$ are close. In practice, this requires that $|f_s - f_q|$ is less than about $f_q/Q_L$. From Equation 2, it follows that $$\delta_s = \frac{f_s - f_q}{f_q} \quad \text{Eq. 3}$$

Notably, $\delta_s$ may be either positive or negative. Accordingly, it is assumed that the corresponding VCO control voltage is $V_S$, which may also be either positive or negative depending on the device.

Using the difference between the oscillation frequency of the VCO and the resonant frequency of a cavity resonator (either open or closed), it is possible to cause the frequency of oscillation of the VCO to lock on the resonant frequency of the cavity as described below.

One such VCO is a varactor voltage controlled Gunn oscillator similar to the Millitech Model Number WBV-28-220160RI, that operates in the frequency range from about 34 GHz to about 36 GHz. As would be appreciated by one of ordinary skill in the art, the techniques described herein are also applicable to other kinds of voltage controlled oscillators that operate at very different frequencies (either higher or lower). For the Millitech device, $V_S$ is negative and the oscillation frequency increases as $V_S$ becomes more negative. In the following description, behavior similar to the Millitech device's is assumed.

Rather than using a fixed control voltage, it is possible to apply a small amplitude time-varying voltage to the frequency controlling input terminal of the VCO. Thus, the control voltage $v_c(t)$ may be written in the form:

$$v_C(t) = V_S + v_s \quad \text{Eq. 4a}$$

where $v_s$, the so-called "dither voltage," is a function of time. In one embodiment, the dither voltage is a symmetrical square wave. In an alternate embodiment, the dither voltage is a sinusoidal signal.

Let $$v_s(t) = v_d f(t) \quad \text{Eq. 4b}$$

where $v_d$ is the peak amplitude of the dither voltage. Then, the function f(t) is bounded by −1 and 1. When using a symmetrical square wave as a component of the dither voltage, the resulting normalized frequencies may be expressed in the form:

$$\delta_+ = \delta_s - a/2Q_L \quad \text{Eq. 5a}$$

when the square wave is positive, and in the form:

$$\delta_- = \delta_s + a/2Q_L \quad \text{Eq. 5b}$$

when the square wave is negative. That is, it is assumed that a small signal approximation is valid and that the change in $\delta$ is proportional to the change in the control voltage. The positive parameter "a" is proportional to the square wave amplitude and has been introduced to facilitate numerical calculations. Its value depends on the details of the relationship between the control voltage and the oscillation frequency for the particular VCO, and it can be related to the amplitude of the square wave "dither voltage."

For the sake of discussion, $\delta_s$, is assumed to be positive (i.e., the operating frequency for $v_s=0$ is greater than $f_q$ so that the operating point is to the right of the peak of the power transmission curve shown in FIG. 1).

From FIG. 1 and Equations 1, 5a, and 5b, it follows that the power transmission through the resonator will be greater when the square wave is positive ($\delta=\delta_+$) than when the square wave is negative ($\delta=\delta_-$). It is useful to recognize that if $\delta_s$ were negative rather than positive, then the opposite would be true. A control voltage for the VCO can be derived from the difference between these two transmitted powers. Consider $$\frac{\Delta T(\delta_s)}{T(0)} \equiv \frac{T(\delta_s - a/2Q_L) - T(\delta_s + a/2Q_L)}{T(0)} = \frac{T(\delta_+) - T(\delta_-)}{T(0)} \quad \text{Eq. 6}$$

Figure 2:
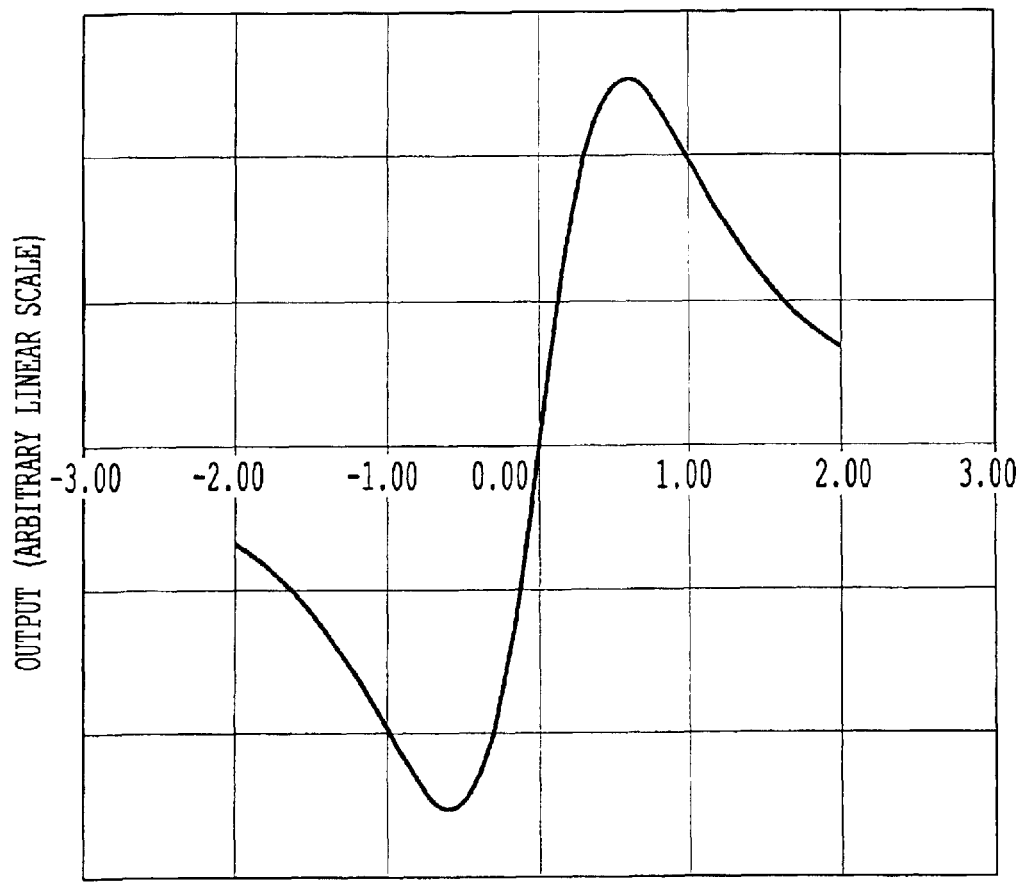
FIG. 2 is a graph of a discriminator output.

With the aid of Equation 1, it can be shown that:

$$\frac{\Delta T(\delta_s)}{T(0)} = \frac{8 Q_L \delta_s a}{[1 + (2Q_L)^2(\delta_s^2 + (a/2Q_L)^2)]^2 - (4Q_L \delta_s a)^2} \quad \text{Eq. 7}$$

and that the same expression is also valid if $\delta_s$ is negative. Equation 7 represents an asymmetric function of $\delta_s$ as shown in the graph of FIG. 2.

The power transmitted through the resonator may be sampled and measured using a crystal diode detector, for which the voltage output is very nearly proportional to the power incident upon it. Therefore, a circuit that can appropriately process the voltage output of a crystal diode that responds to the power transmitted through the resonator can be used to produce an output voltage that is essentially proportional to $\Delta T(\delta_s)$ as given by Equation 7.

The voltage produced by the control circuit will be positive when the oscillation frequency $f_s$ is greater than the reference frequency $f_q$, 0 when $f_s = f_q$, and negative when $f_s$ is less than $f_q$. This correction voltage $v_{corr}$, which will typically be a slowly varying or quasi-DC voltage will be fed to the frequency controlling voltage input terminal of the VCO in series with the DC voltage $V_s$ and the dither voltage $v_s$. Consequently, with the addition of the correction voltage $v_{corr}$, Equation 4 becomes:

$$v_c = V_S + v_s + v_{corr} \quad \text{Eq. 8}$$

An exemplary range for the dither voltage amplitude (peak-to-peak) is 1 to 50 mV. In general, the dither amplitude should be chosen such that it is less than approximately one half the detected voltage at the cavity resonance being tracked and, preferably as small as possible. Secondly, it should be noted that for robust locking over a range of RF power and pressure, the dither voltage amplitude and/or dither frequency may be varied. Thirdly, the dither frequency should range from 1 kHz to 100 kHz.

Figure 3:
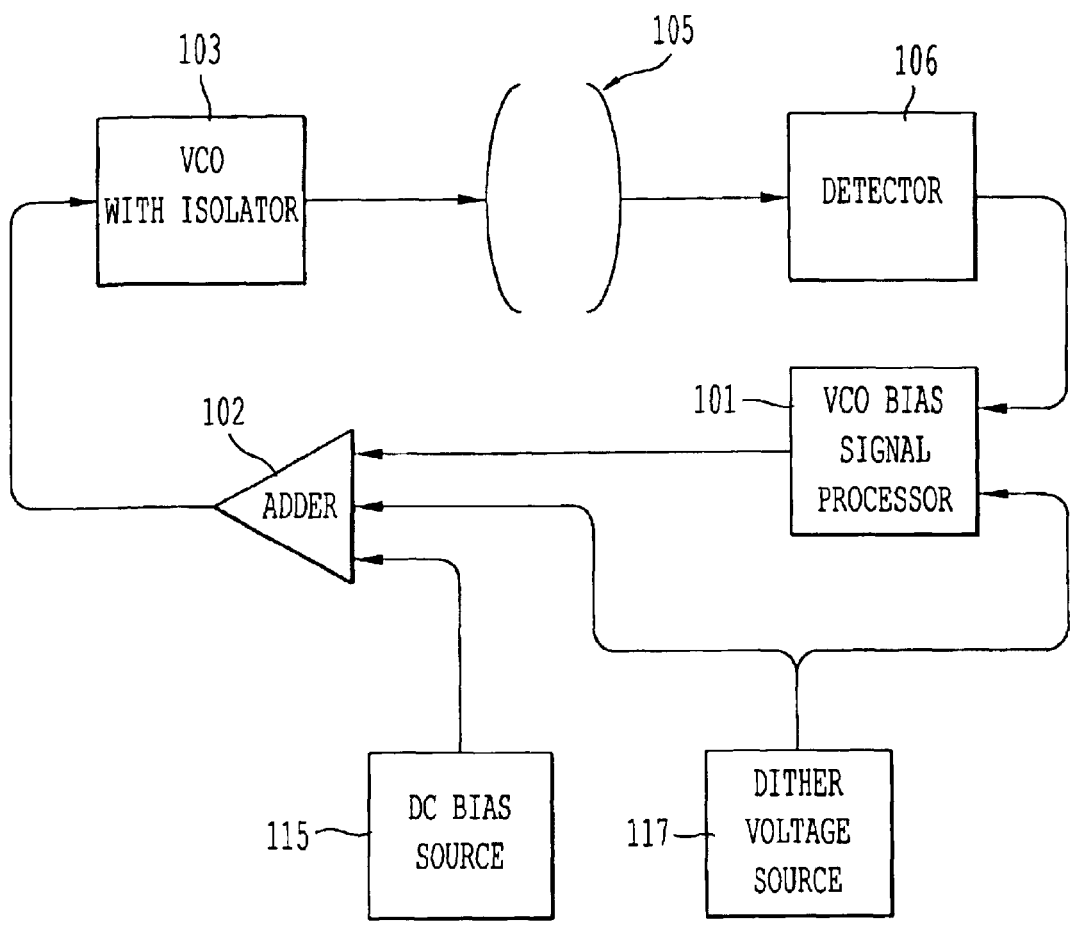
FIG. 3 is block diagram of a dither control circuit according to a first embodiment.

FIG. 3 is a block diagram of a stabilization system based on the transmission properties discussed above. When the stabilization circuit is properly adjusted, the frequency of the VCO (with an internal isolator) 103 is locked to (i.e., is virtually the same as) the resonant frequency of the open resonator 105. If the resonant frequency of the open resonator 105 changes, the oscillation frequency of the VCO 103 will change by an equivalent amount and the VCO 103 will continue to excite the open resonator 105 at its changed resonant frequency.

As shown in FIG. 3, the VCO 103 is coupled to an open microwave resonator 105. The microwave resonator 105 is used as a transmission cavity and includes reflecting mirrors at each end. The resonator 105 has separate input and output apertures, both of which may be on the same mirror, or the input aperture may be on one mirror and the output aperture on the other. The latter configuration may be preferable to lessen the likelihood that undesired off-axis modes will be excited or detected.

Coupled to the output aperture of the resonator 105 is a detector 106 (e.g., a crystal detector) for detecting the power transmitted through the resonator 105. The detector 106 and a dither voltage source 117 are connected to a VCO bias signal generator 101 (shown in greater detail in FIG. 4). The outputs of (1) the VCO bias signal generator 101, (2) the dither voltage source, and (3) the DC bias source are fed to the adder 102 that outputs the control voltage back to the VCO 103.

Figure 4A:
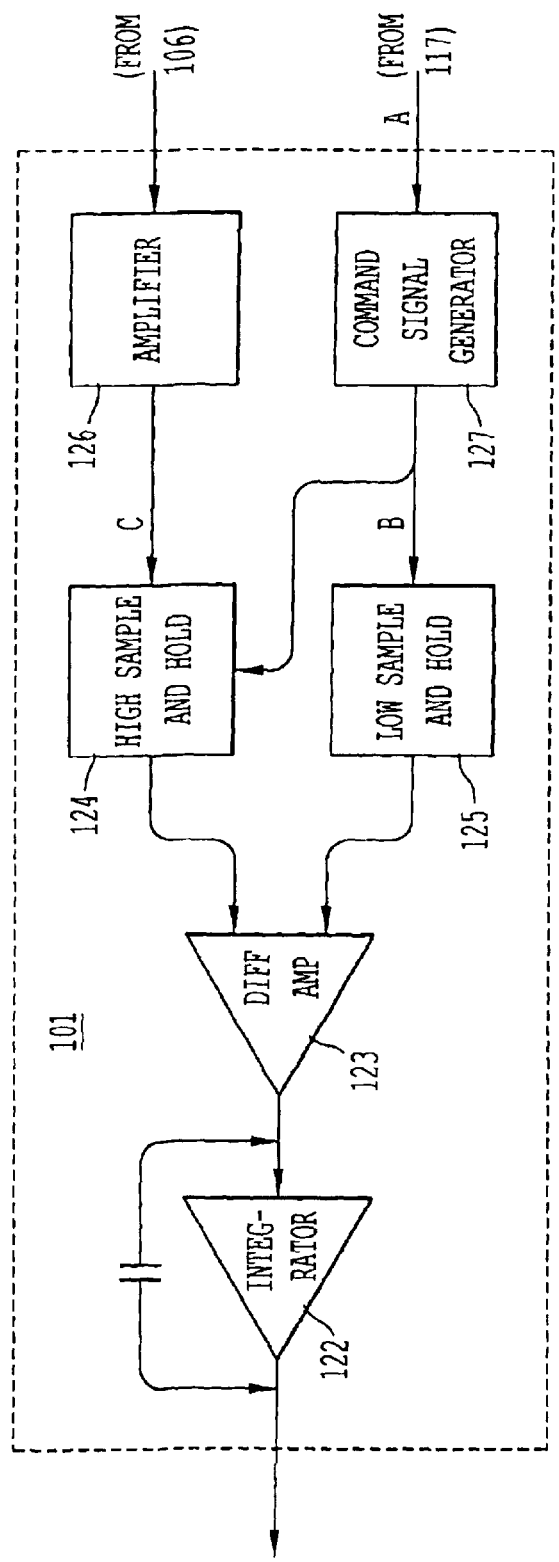
FIG. 4A is a VCO bias signal processor.
Figure 4B:
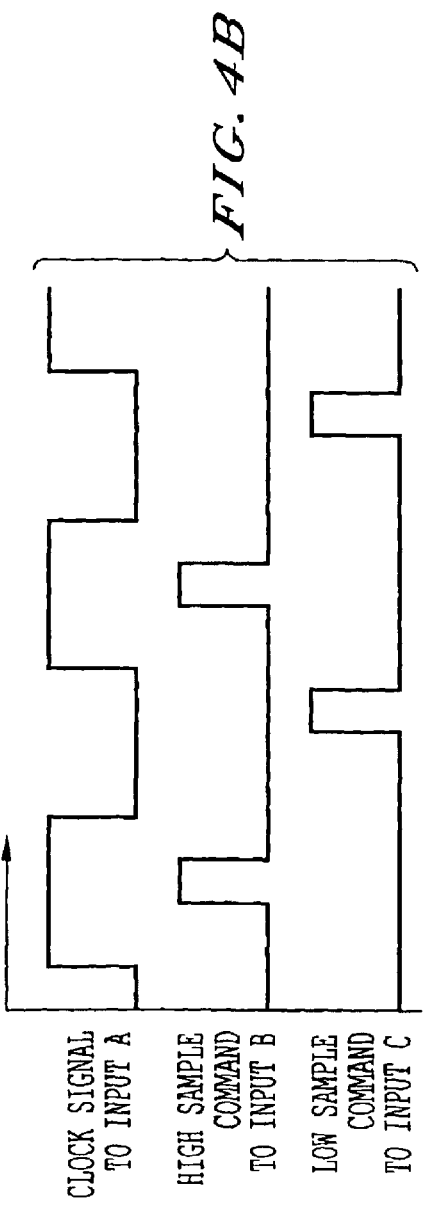
FIG. 4B is a timing diagram showing control signals according to the present invention.

A block diagram of one embodiment of the VCO bias signal processor 101 is shown in FIG. 4A. The dither (or clock) signal from dither voltage source 117 is processed by high and low sample and hold circuits (124 and 125, respectively) to provide high and low sample command signals, respectively, that act as the two phases of the dither signal. The high sample command signal permits the sample-and-hold circuit 124 to monitor the output of amplifier 126 only when the dither (or clock) signal is positive. Likewise, the low sample command signal permits the sample-and-hold circuit 125 to monitor the output of amplifier 126 only when the dither (or clock) signal is negative. The relative timings of the command signals is shown in FIG. 4B. Differential amplifier 123 provides the difference of the outputs of the sample-and-hold circuits 124 and 125, and the integrator 122 limits the effects of transients to acceptable levels.

In addition, the integrator 122 facilitates locking the VCO 103 onto the desired open resonator mode at start-up. For example, at start-up, the VCO DC bias voltage, $V_S$, may be set to a value corresponding to an oscillator frequency, $f_s$, slightly above the frequency of the desired open resonator mode, $f_q$. The capacitor in the integrator 122 may then be charged to a voltage that when added algebraically to $V_S$ by adder 102 results in an oscillator frequency slightly less than $f_q$. As the integrator capacitor discharges, the frequency $f_s$ will increase and approach $f_q$ and at some frequency during this approach the stabilization circuit will engage.

Figure 5:
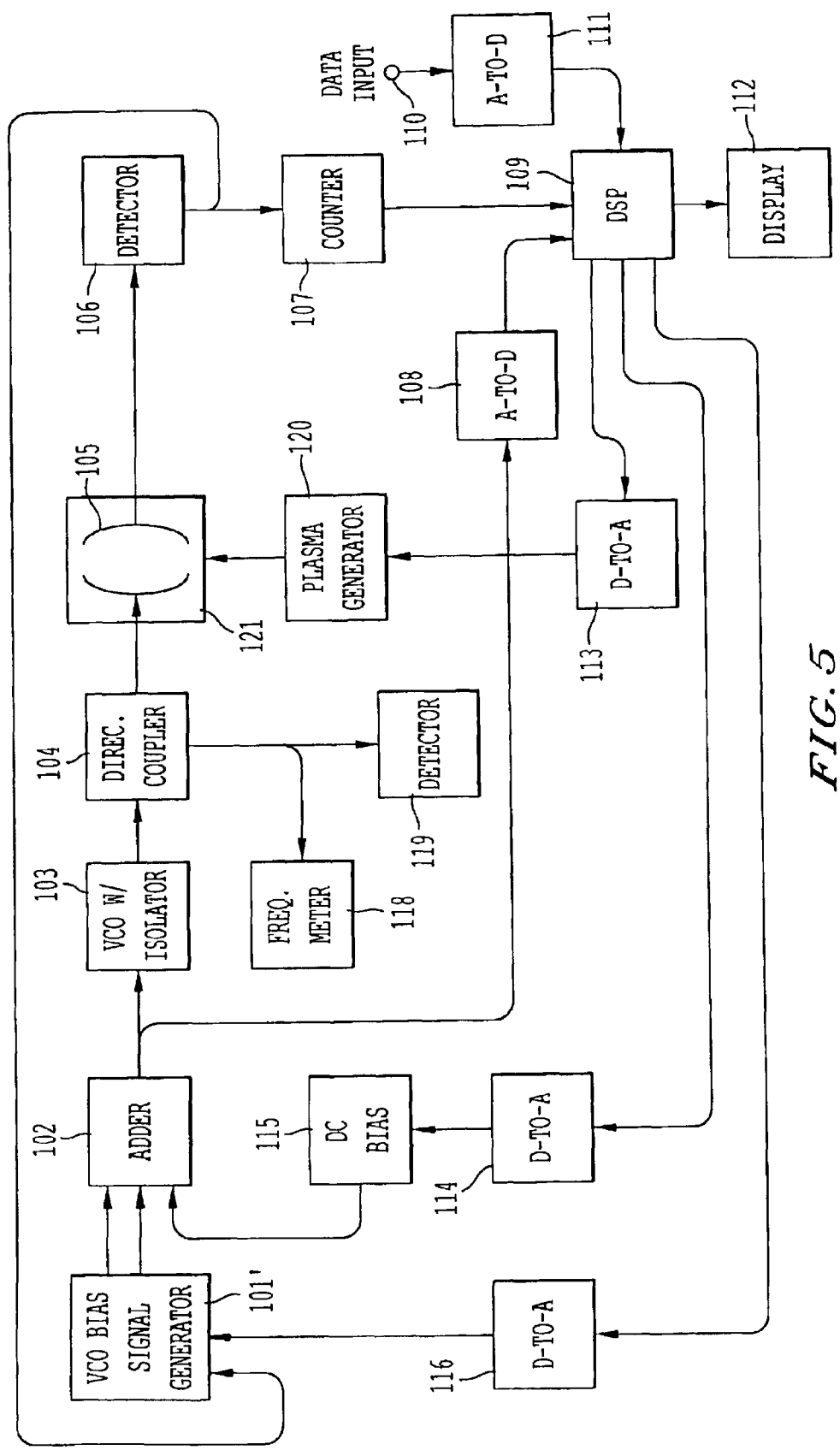
FIG. 5 is a block diagram showing an expanded system diagram according to a second embodiment.

A block diagram of one embodiment of a plasma generator control system according to the present invention is shown in FIG. 5. Other embodiments are, of course, possible. Some of these alternate embodiments may not include such complete control of the circuit function by means of the DSP 109. Note that the determination of the control voltage for the plasma generator in the present invention is accomplished without the use of a microwave discriminator, such as discriminators 110 and 110' in FIGS. 4 and 5 of the co-pending application No. 60/144,880.

The digital signal processor (DSP) 109 shown in FIG. 5 responds to three inputs: (1) the digital equivalent of the voltage at the frequency controlling input terminal of the VCO input to the DSP via A-to-D 108; (2) one of either the desired voltage at the frequency controlling input terminal of the VCO, or the desired mean plasma density in the open resonator, or the desired frequency of the VCO; entered by means of a keyboard at the data input terminal or a potentiometer with the aid of an A/D converter as shown in FIG. 5; and (3) the signal from a counter connected to the detector at the output of the open resonator. The DSP 109 provides output signals to control at least one of (1) the output power of the plasma generator; (2) the DC bias voltage for the VCO; (3) the amplitude of the dither voltage signal for the VCO; (4) the dither frequency; and (5) a display means. The output signal from the DSP to the plasma generator 120 adjusts the power provided by the plasma generator to the plasma chamber 105 as required to achieve the desired process parameters. FIG. 5 includes a directional coupler 104 and a frequency meter 118 between the VCO 103 and the plasma chamber 105 to permit an independent determination of the oscillator frequency whenever it may seem prudent to do so. No discrete isolator is shown between the VCO and the plasma chamber in FIG. 5 because it is assumed that the VCO includes an integral isolator. However, if the VCO does not include an integral isolator, an isolator should be inserted in the circuit between the VCO and the plasma chamber.

A change in the plasma generator control voltage causes the plasma density to change which in turn causes the resonant frequency of the open resonator to change and, therefore, the output of the detector to change. The detector signal causes the VCO bias signal processor output to change and the voltage applied to the VCO frequency controlling input to change. Consequently, the oscillation frequency of the VCO changes. The DSP compares the digital equivalent of the VCO control voltage to the desired value based upon the input data and sends an appropriate control signal to the plasma generator.

If the electromagnetic field in the open resonator collapses due to loss of control of the VCO frequency for any reason, the output of the detector in the output line of the open resonator will drop to zero and the counter 107 will record the event. If such an event takes place, the frequency of the VCO is no longer controlled by the resonant frequency of the open resonator, and "loss of lock" has occurred. Co-pending application No. 60/144,880 considers in some detail the issue of "loss of lock." Loss of frequency control can be used to instruct the DSP to initiate an algorithm to reestablish frequency lock or to alert an equipment operator to loss of control and the possibility of equipment malfunction. It should be noted that a zero output from the detector implies that the VCO frequency is not locked to a resonant frequency of the open resonator.

The sampling period of the system is chosen to ensure that "loss of lock" will be recognized by the DSP. The DSP may then employ various algorithms to reestablish lock between the VCO frequency and the resonant frequency of the open resonator. A first such algorithm calculates an expected plasma density based on one or more measured parameters such as radio frequency (RF) power, gas pressure, gas flow rate, plasma chamber temperature, and plasma optical signature. The DSP then searches for a discriminator zero (e.g., as shown in FIG. 2) within prescribed frequency limits. A second such algorithm measures the frequency differences between adjacent resonant modes to determine an approximate plasma density and then conducts a search for a discriminator zero in the neighborhood of the so-determined plasma density.

Figure 6A:
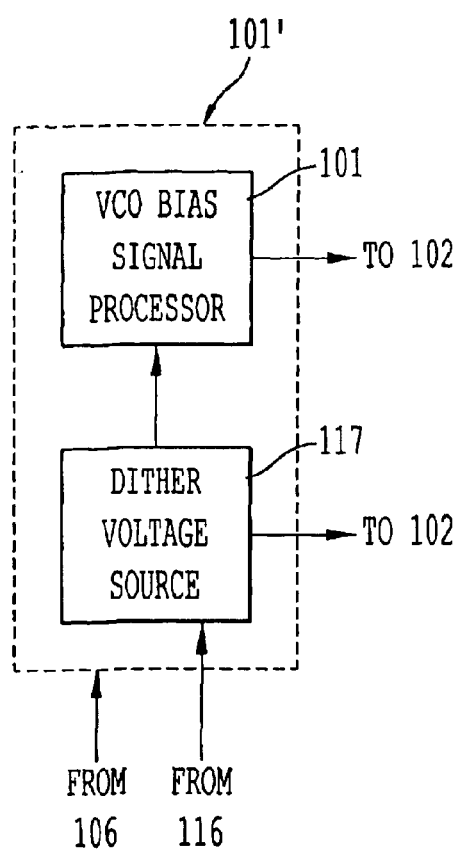
FIGS. 6A and 6B are block diagrams of alternate embodiments of self-clocking VCO bias signal processors.
Figure 6B:
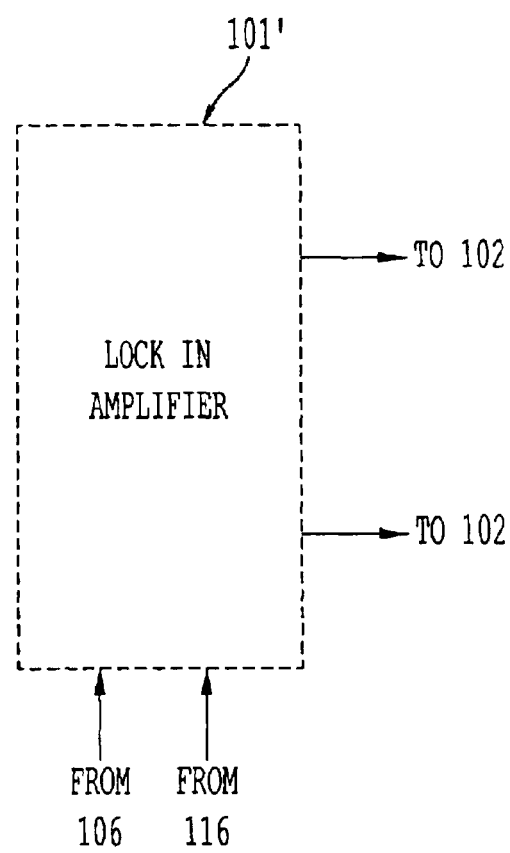

As depicted in FIG. 5, the VCO bias signal processor has been replaced with a self-clocking VCO bias signal processor. In the embodiment illustrated in FIG. 6A, the VCO bias signal processor includes a VCO bias signal processor 101 and a dither voltage source 117. In the embodiment illustrated in FIG. 6B, the VCO bias signal processor includes a signal processor comprising a lock-in amplifier that includes a sinusoidal dither voltage signal. Lock-in amplifiers are especially useful for processing weak signals in the presence of noise, which is advantageous for the present application. The operation of lock-in amplifiers has been described elsewhere. (*Lock-in amplifiers: principles and applications*, by M. L. Meade, Peter Peregrinus, Ltd., London, 1983. See also, Robert D. Moore, "Lock-in amplifiers for signals buried in noise," *Electronics*, Vol. 35, pp. 40–43, Jun. 8, 1962.)

If the analysis of the resonant behavior of the open resonator is approached from an optical perspective, rather than from a microwave circuit perspective employed earlier in this disclosure, an equation that is equivalent to Eq. 1 may be obtained. Let the resonant frequency of an on-axis mode (e.g., a $TEM_{00q}$ mode, which is the mode of interest here), be $f_q$, where $$f_q \equiv \frac{c}{2d}\left(q + \frac{1}{2}\right) \qquad \text{Eq. 9}$$

(Note: The usual notation for the resonant frequency of the $TEM_{00q}$ mode is $f_{00q}$, but because these are the only modes of interest here, the resonant frequency $f_{00q}$ is represented by the simpler notation $f_q$.)

The normalized power transmission through the open resonator T(f) may be expressed by:

$$T(f) = \frac{T(f_q)}{1 + \left[\frac{2F}{\pi}\right]^2 \sin^2\left(\frac{2\pi f d}{c}\right)} \qquad \text{Eq. 10}$$

where f is the frequency, c is the speed of light in vacuum, d is the mirror separation, and F is the so-called finesse, which is defined as (c/2d) divided by the difference between the two frequencies nearest $f_q$ for which $T(f)=(1/2)T(f_q)$. Consider a Taylor series expansion of T(f) in the neighborhood of $f_s$, where $f_s$ is a frequency for which Eq. 10 is valid:

$$T(f) \approx T(f_s) + \left(\frac{\partial T}{\partial f}\right)_{f=f_s}(f - f_s) + \frac{1}{2}\left(\frac{\partial^2 T}{\partial f^2}\right)_{f=f_s}(f - f_s)^2 + \Lambda \qquad \text{Eq. 11}$$

In general the frequency change $f-f_s$ is related to a corresponding change in the control voltage; i.e., if $f-f_s$ is not too large one may write $$f - f_s \approx \left(\frac{\partial f}{\partial v_C}\right)(v_C - V_S) \qquad \text{Eq. 12}$$

where $V_S$ is the DC control voltage for which the oscillator frequency is $f_s$, and the derivative is to be evaluated for $v_C = V_S$.

Assume that the dither voltage is given by:

$$v_d = V_d \cos(\omega_d t) = v_C - V_S \qquad \text{Eq. 13}$$

Then with the aid of Eqs. 11, 12, and 13, one may obtain an expression for the normalized average power transmitted through the cavity as a function of time, where the average is taken over a time interval that is long compared to the period of the microwave signal but short compared to the period of the dither signal. The result is:

$$P_{AVG} \approx T(f_s) + \left(\frac{\partial T}{\partial f}\right)_{f=f_s}\left[\left(\frac{\partial f}{\partial v_C}\right)_{v_C=V_S} V_d \cos(\omega_d t)\right] + \frac{1}{2}\left(\frac{\partial^2 T}{\partial f^2}\right)_{f=f_s}\left[\left(\frac{\partial f}{\partial v_c}\right)_{v_C=V_S} V_d \cos(\omega_d t)\right]^2 + K \qquad \text{Eq. 14}$$

The output voltage of a square law detector (e.g., a crystal detector) connected to the output port of the open resonator will be proportional to $P_{AVG}$. The second term in Eq. 14 is of special interest here, for it leads to the error signal for adjusting the frequency of the VCO. In this embodiment a lock-in amplifier is used to obtain the desired error signal.

The reference voltage $v_d \cos(\omega_d t)$ of the lock-in amplifier also serves as the dither voltage. The lock-in amplifier includes an integrator and produces a nominally time-independent output voltage, $v_{out}$, which may vary if the amplitude and phase of the input signal change slowly with respect to the phase of the reference signal. For the application of interest here, the output voltage $v_{out}$ is approximately given by:

$$v_{out} = K \left(\frac{\partial T}{\partial f}\right)_{f=f_s} \left(\frac{\partial f}{\partial v_C}\right)_{v_C=v_S} V_d \qquad \text{Eq. 15}$$

where K is a constant of proportionality. Note that the algebraic sign of $v_{out}$ depends on whether $f_s$ is greater than or less than $f_q$, because the slope of T(f) is positive when f is less than $f_q$ and negative when f is greater than $f_q$. (This algebraic sign change is equivalent to a 180 degree phase change.) The voltage $v_{out}$ provides the feedback voltage for controlling the frequency of the VCO 103 through the adder 102. Depending on the voltage characteristic of the VCO 103, however, it may be necessary to insert an inverting amplifier between the lock-in amplifier and the adder to ensure that the algebraic sign of the error voltage at the frequency controlling input terminal of the VCO will cause the VCO frequency to move toward $f_q$, rather than away from it.

The ability of a lock-in amplifier to detect weak signals in the presence of noise is due to its use of an internal narrow-band amplifier and an internal integrator. However, the ability of a lock-in amplifier to amplify accurately a signal for which the amplitude and phase vary with time is limited by its so-called "settling time." For use in the application considered here, the settling time must not be too great. Otherwise, the VCO may not be able to remain locked to the resonant frequency of the open resonator as the plasma density changes, especially upon initiation of the plasma.

The digital signal processor 109 is programmed to control at least one of (a) the output power of the plasma generator; (b) the DC bias voltage for the VCO; (c) the reference (i.e., dither) voltage amplitude $v_d$; (d) the reference signal frequency $\omega_d$; (e) the gain of the lock-in amplifier; (f) the settling time of the lock-in amplifier; and (e) a display means.

Obviously, numerous modifications and variations of the present invention are possible in light of the above teachings. It is therefore to be understood that, within the scope of the appended claims, the invention may be practiced otherwise than as specifically described herein.

What is claimed is:

1. A device for measuring electron density of a plasma in a plasma chamber comprising:
   an open microwave resonator coupled to said plasma chamber, and configured to be immersed in said plasma;
   a voltage controlled oscillator coupled to said open microwave resonator, said voltage controlled oscillator configured to be controlled by a feedback signal and configured to produce an excitation signal corresponding to at least one resonant mode in said open microwave resonator;
   a detector coupled to said open microwave resonator, and configured to measure said excitation signal, said feedback signal being generated based on an output of said detector;
   a dither voltage source for generating a dither voltage; and
   an adder for adding said dither control voltage source to said feedback signal and for applying an output of said adder to a voltage control input of said voltage controlled oscillator, wherein said output facilitates minimizing a difference between said excitation signal and said at least one resonant mode.

2. The device of claim 1, wherein said open microwave resonator comprises a first mirror and a second mirror opposite said first mirror.

3. The device of claim 2, wherein said voltage controlled oscillator is coupled to at least one of said first mirror and said second mirror.

4. The device of claim 2, wherein said detector is coupled to at least one of said first mirror and said second mirror.

5. The device of claim 1, wherein said dither voltage comprises at least one of a square wave and a sinusoidal signal.

6. The device of claim 1, wherein the peak-to-peak amplitude of said dither voltage ranges from 1 to 50 mV.

7. The device of claim 1, wherein the dither frequency of said dither voltage ranges from 1 to 100 kHz.

8. The device of claim 1, further comprising a voltage control bias signal generator for generating said feedback signal from said detector.

9. The device of claim 8, wherein the voltage control bias signal generator comprises an amplifier configured to receive said excitation signal from said detector and produce an amplified signal, a command signal generator configured to receive said dither voltage from said dither control voltage source, a high sample and hold device configured to receive said amplified signal from said amplifier and receive said dither voltage from said command signal generator, a low sample and hold device configured to receive said dither voltage from said command signal generator, a differential amplifier configured to receive a high sample and hold device output and a low sample and hold device output, and an integrator configured to receive a differential amplifier output and provide an input signal to said adder.

10. The device of claim 1, wherein said open microwave resonator comprises a confocal resonator.

11. A method of monitoring and controlling an electron density of a plasma generated by a plasma generator in a plasma chamber comprising:
   locking an excitation signal from a voltage controlled oscillator to at least one resonant mode in an open microwave resonator immersed in said plasma by controlling said voltage controlled oscillator using a feedback signal, wherein said feedback signal comprises a dither voltage and a correction signal based on an output of a detector coupled to the open microwave resonator;
   recording a first feedback signal;
   igniting a plasma in said plasma chamber after said first feedback signal is recorded;
   recording a second feedback signal after said plasma is ignited; and
   measuring an electron density of said plasma from a difference between said second feedback signal and said first feedback signal.

12. The method of claim 11, wherein said open microwave resonator comprises a first mirror and a second mirror opposite said first mirror.

13. The method of claim 12, wherein said voltage controlled oscillator is coupled to at least one of said first mirror and said second mirror.

14. The method of claim 12, wherein said detector is coupled to at least one of said first mirror and said second mirror.

15. The method of claim 11, wherein said dither voltage comprises at least one of a square wave and a sinusoidal signal.

16. The method of claim 11, wherein the peak-to-peak amplitude of said dither voltage ranges from 1 to 50 mV.

17. The method of claim 11, wherein the dither frequency of said dither voltage ranges from 1 to 100 kHz.

18. The method of claim 11, further comprising generating said correction signal using a voltage control bias signal generator.

19. The method of claim 18, wherein voltage control bias signal generator comprises an amplifier configured to receive said excitation signal from said detector and produce an amplified signal, a command signal generator configured to receive said dither voltage from a dither control voltage source, a high sample and hold device configured to receive said amplified signal from said amplifier and receive said dither voltage from said command signal generator, a low sample and hold device configured to receive said dither voltage from said command signal generator, a differential amplifier configured to receive a high sample and hold device output and a low sample and hold device output, and an integrator configured to receive a differential amplifier output and provide said correction signal to an adder.

20. The method of claim 11, further comprising:

specifying a target electron density;

comparing said measured electron density with said target electron density; and adjusting said plasma generator in order to minimize a difference between said measured electron density and said target electron density.

21. The method of claim 11, wherein said open microwave resonator comprises a confocal resonator.

22. The method of claim 20, wherein said adjusting said plasma generator comprises adjusting a power coupled to said plasma by said plasma generator.

* * * * *